(12) United States Patent
Fang

(10) Patent No.: US 9,614,105 B2
(45) Date of Patent: Apr. 4, 2017

(54) CHARGE-TRAP NOR WITH SILICON-RICH NITRIDE AS A CHARGE TRAP LAYER

(71) Applicant: Cypress Semiconductor Corporation, San Jose, CA (US)

(72) Inventor: Shenqing Fang, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 212 days.

(21) Appl. No.: 13/867,618

(22) Filed: Apr. 22, 2013

(65) Prior Publication Data
US 2014/0312408 A1     Oct. 23, 2014

(51) Int. Cl.
| | |
|---|---|
| H01L 29/792 | (2006.01) |
| H01L 21/762 | (2006.01) |
| H01L 29/66 | (2006.01) |
| H01L 21/28 | (2006.01) |
| H01L 29/51 | (2006.01) |
| H01L 27/11568 | (2017.01) |

(52) U.S. Cl.
CPC ...... *H01L 29/792* (2013.01); *H01L 21/28282* (2013.01); *H01L 21/76224* (2013.01); *H01L 27/11568* (2013.01); *H01L 29/518* (2013.01); *H01L 29/66833* (2013.01)

(58) Field of Classification Search
CPC .......... H01L 29/792; H01L 21/76224; H01L 27/11568; H01L 21/28282; H01L 29/518; H01L 29/66833
See application file for complete search history.

(56) References Cited

U.S. PATENT DOCUMENTS

| | | | |
|---|---|---|---|
| 4,242,737 A * | 12/1980 | Bate .................. | G11C 16/0466 148/DIG. 156 |
| 8,035,153 B2 | 10/2011 | Fang et al. | |
| 8,208,296 B2 | 6/2012 | Thurgate et al. | |
| 8,263,458 B2 | 9/2012 | Chen et al. | |
| 2006/0240612 A1 | 10/2006 | Lee | |
| 2008/0160680 A1* | 7/2008 | Yuan ................ | H01L 27/11568 438/129 |
| 2008/0265301 A1* | 10/2008 | Fang ................ | H01L 27/11568 257/315 |
| 2008/0277712 A1 | 11/2008 | Ding et al. | |
| 2010/0133646 A1* | 6/2010 | Fang ................ | H01L 21/28282 257/506 |
| 2010/0302855 A1* | 12/2010 | Yang ................ | G11C 16/0475 365/185.18 |
| 2011/0014758 A1 | 1/2011 | Joo et al. | |
| 2011/0057248 A1 | 3/2011 | Ma et al. | |
| 2011/0220981 A1* | 9/2011 | Chen ................ | G11C 16/0441 257/316 |
| 2012/0058619 A1 | 3/2012 | Park et al. | |
| 2012/0153377 A1 | 6/2012 | Fang et al. | |
| 2012/0156856 A1 | 6/2012 | Chen et al. | |

OTHER PUBLICATIONS

Utility U.S. Appl. No. 13/680,726, entitled "Method to Improve Charge Trap Flash Memory Core Cell Performance and Reliability," 16 pages.
International Search Report and Written Opinion of the International Searching Authority for International Application No. PCT/US2014/034967, mailed Aug. 19, 2014.

* cited by examiner

*Primary Examiner* — Ermias Woldegeorgis

(57) ABSTRACT

A charge-trapping NOR (CT-NOR) memory device and methods of fabricating a CT-NOR memory device utilizing silicon-rich nitride (SiRN) in a charge-trapping (CT) layer of the CT-NOR memory device.

6 Claims, 11 Drawing Sheets

CHARGE-TRAP NOR WITH SILICON-RICH NITRIDE AS A CHARGE TRAP LAYER

FIELD

This application relates generally to memory fabrication, and more particularly to a semiconductor processing method for flash memory fabrication.

BACKGROUND

Memory devices can be broadly categorized into two classes: volatile memory and non-volatile memory. Volatile memory (e.g., SRAM, DRAM, or the like) lose their data content when the power supply is removed. In contrast, non-volatile memories (e.g., EEPROM, flash memories, or the like) maintain their data content after the power supply has been removed.

Flash memory is a non-voltage memory that can be electrically erased and reprogrammed. One common type of flash memory device is charge-trap (CT) flash memory. The basic concept of a charge-trap flash memory cell is that of a CT layer in a semiconductor transistor. The electrical isolation of the CT layer is accomplished by surrounding it with dielectric material, such as an oxide. Typically, charge trap flash memory cells use two oxide layers, a "bottom" oxide layer and a "top" oxide layer.

SUMMARY

Described herein are exemplary embodiments of a charge-trap (CT) NOR flash memory device and fabrication method. According to an exemplary embodiment, a charge-trapping NOR flash memory device is fabricated by forming shallow trench isolation (STI) regions on a substrate, forming a tunneling dielectric layer on the substrate and the STI regions, forming a silicon-rich nitride (SiRN) layer on the tunneling dielectric layer, forming a blocking dielectric layer on the SiRN layer, and forming a gate region on the blocking dielectric region.

These and other advantages, aspects and novel features of the invention, as well as details of exemplary embodiments thereof, will be more fully understood from the following description and drawings.

BRIEF DESCRIPTION OF THE DRAWINGS/FIGURES

The accompanying drawings, which are incorporated herein and form a part of the specification, illustrate exemplary embodiments of the present invention and, together with the description, further serve to explain principles of the invention and to enable a person skilled in the pertinent art to make and use the invention.

Figure 1:
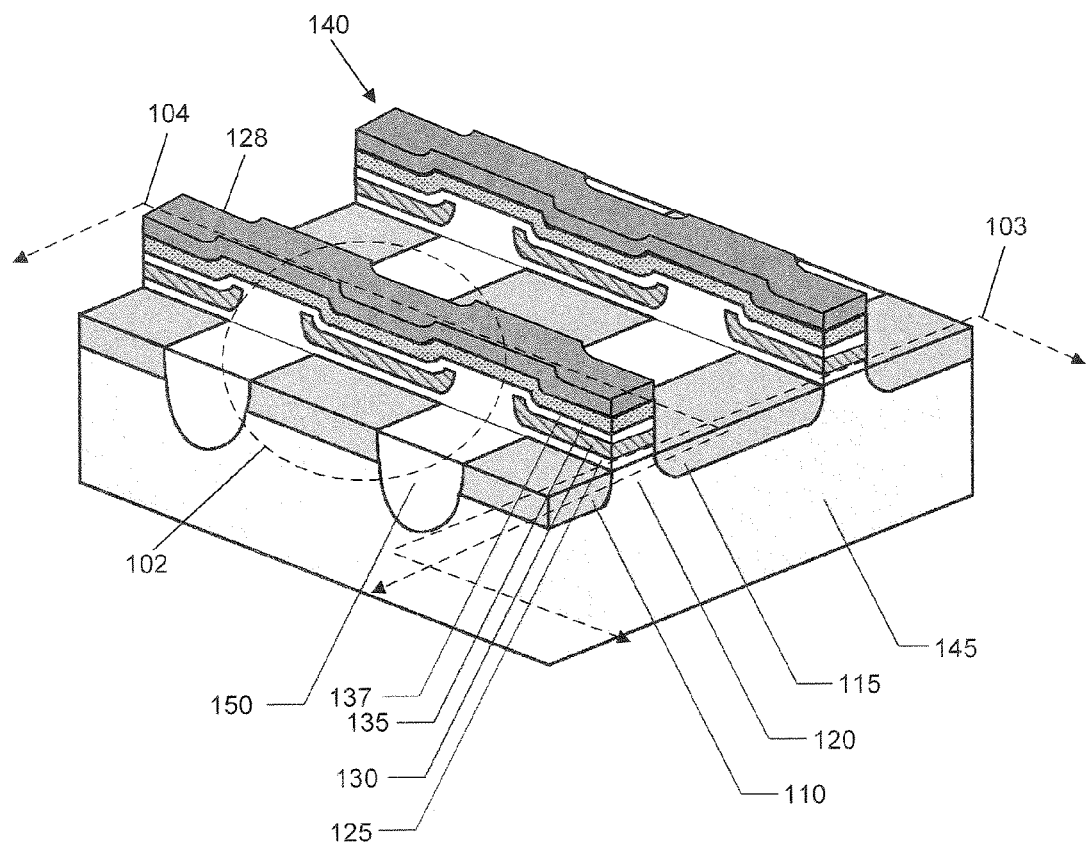
FIG. 1 illustrates a block diagram of a memory cell array structure according to an exemplary embodiment.

Embodiments will be described with reference to the accompanying drawings. In the drawings, like reference numbers generally indicate identical or functionally similar elements. The drawing in which an element first appears is typically indicated by the leftmost digit(s) in the corresponding reference number.

DETAILED DESCRIPTION

FIG. 1 illustrates a charge-trapping NOR (CT-NOR) memory array structure 100, including one or more CT-NOR memory devices 102, according to an exemplary embodiment. In an exemplary embodiment, each CT-NOR memory devices 102 can be separated by a shallow trench isolation (STI) region 150. Each CT-NOR memory device 102 can include a drain region 110, a source region 115, a channel region 120, a tunneling dielectric layer 125 (also referred to as a bottom dielectric layer), a charge trapping layer 130, a blocking dielectric layer 135 (also referred to as a top dielectric layer), and a gate layer 128 that defines a gate region 140. In an exemplary embodiment, and as discussed in more detail below, each CT-NOR memory device 102 can also include one or more gate dielectrics 137 that are formed on the blocking dielectric layer 135.

The source and drain regions 110, 115 can be semiconductor regions of a substrate 145 having a heavy doping concentration of a first type of impurity. For example, areas of the substrate 145 corresponding to the source and drain regions 110, 115 can be silicon heavily doped with phosphorous and/or arsenic. Alternative doping materials can be used as will be apparent to those skilled in the relevant art(s).

In an exemplary embodiment, the channel region 120 can be a semiconductor region of the substrate 145 having moderate doping concentration of a second type of impurity, disposed laterally between the source and drain regions 110, 115. For example, the channel region 120 can be silicon moderately doped with boron. Alternative doping materials can be used as will be apparent to those skilled in the relevant art(s).

In an exemplary embodiment, the tunneling dielectric layer 125 can be a dielectric layer disposed over the channel region 120 and adjacent portions of the source and drain regions 110, 115. For example, the tunneling dielectric layer 125 can be silicon dioxide, oxynitride, silicon oxynitride, or the like.

The charge-trapping (CT) layer 130 can be a dielectric, semiconductor or the like disposed between the tunneling dielectric layer 125 and the blocking dielectric layer 135. In an exemplary embodiment, the CT layer 130 can be a silicon-rich nitride (SiRN) layer. That is, the silicon content of the SiRN CT layer 130 is greater than the silicon content of a standard silicon-nitride CT layer. For the purposes of this discussion, a standard nitride CT layer refers to a stoichiometric silicon-nitride CT layer (e.g., stoichiometric SiN materials). For example, the SiRN CT layer 130 can have a coefficient of extinction (k) value of, for example, 1.19, while a standard nitride CT layer can have a coefficient of extinction (k) value of zero, where the coefficient of extinction (k) values are measured at a wavelength of 248 nanometers (nm). However, the coefficient of extinction (k) is not limited to such values. Instead, the coefficient of extinction (k) can have other values as will be apparent to those skilled in the relevant art(s). Increasing the coefficient of extinction (k) value (i.e., increasing the silicon content) results in a SiRN CT layer 130 having increased conductive properties. In contrast, a standard nitride CT layer with a low coefficient of extinction (k) exhibits insulative properties.

In an exemplary embodiment, the SiRN layer 130 is formed of a single layer having a particular silicon content (e.g., a single coefficient of extinction (k) value). In another exemplary embodiment, the SiRN layer 130 is a multi-layer composite SiRN layer 130, including, for example, two or more layers having different silicon contents (e.g., different coefficient of extinction (k) values). For example, the multi-layer composite SiRN layer 130 can include a bottom layer (e.g., the layer closest to the tunneling dielectric layer 125) and a top layer (e.g., the layer closest to the blocking dielectric layer 135), where the bottom layer has a higher silicon content (e.g., a higher coefficient of extinction (k) value) than the top layer. Similarly, in an embodiment where the multi-layer composite SiRN layer 130 includes three or more layers, the one or more intervening layers have intermediate silicon contents (e.g., silicon contents between the silicon contents of the bottom and top layers), with the silicon contents decreasing as the distance from the bottom layer increase. More specifically, for a multi-layer composite SiRN layer 130 with n layers, the silicon contents of the respective layers are $x_1, x_2, x_3, \ldots x_n$, where $x_1 > x_2 > x_3 > x_n$, and the first layer is closest to the tunneling dielectric layer 125 and the $n^{th}$ layer is closest to the blocking dielectric layer 135.

For example, in an exemplary embodiment, the bottom (first) layer of a multi-layer composite SiRN layer 130 (e.g., layer closest to the tunneling dielectric layer 125) has a coefficient of extinction (k) value of 1.19, while the top ($n^{th}$) layer includes a coefficient of extinction (k) value of approximately zero (i.e., the k value associated with standard SiN materials). Intermediate layers $L_2$ to $L_{n-1}$ have respective coefficient of extinction (k) values $x_2$ to $x_{n-1}$, where $1.19 > x_2 > x_{n-1} > 0$. However, the coefficient of extinction (k) values are not limited to such values. Instead, the coefficient of extinction (k) can have other values as will be apparent to those skilled in the relevant art(s). Further, the number of layers in the composite multi-layer formations should not be limited to the examples discussed herein. Instead, a multi-layer composite SiRN layer 130 can be made of a different (e.g., greater) number of layers as will be apparent to those skilled in the relevant art(s).

In an exemplary embodiment, the multi-layer composite SiRN layer 130 can include a bottom layer (e.g., the layer closest to the tunneling dielectric layer 125), a top layer (e.g., the layer closest to the blocking dielectric layer 135), and one or more intervening layers, where the bottom layer has a higher silicon content (e.g., a higher coefficient of extinction (k) value) than the top layer. The one or more intervening layers can have the same silicon contents as the bottom or top layers, or can have intermediate silicon contents (e.g., silicon contents between the silicon contents of the bottom and top layers). In this embodiment, the intervening layers do not necessarily include silicon contents that decrease/increase based their distance to the top/bottom layers. For example, an intervening layer closer to the top layer can have a silicon content greater than another intervening layer that is closer to the bottom layer.

In an exemplary embodiment, the multi-layer composite SiRN layer 130 is formed to have a heterogeneous structure. That is, the multi-layer composite SiRN layer 130 can be formed to include two or more distinct layers having different silicon contents. Conversely, in an exemplary embodiment, the multi-layer composite SiRN layer 130 can formed to have a more transitional structure, where the silicon content of each layer gradually transitions to the silicon content of an adjacent layer. That is, the multi-layer composite SiRN layer 130 can include a transitional portion between each adjacent layer, where the transitional portion has a varying silicon content that transitions from a silicon content of a first adjacent layer to a silicon content of a second adjacent layer. It should also be appreciated that the multi-layer composite SiRN layer 130 can be formed to have a combination of heterogeneous and transitional structures.

In an exemplary embodiment, the multi-layer composite SiRN layer 130 can include a bottom layer (e.g., the layer closest to the tunneling dielectric layer 125), a top layer (e.g., the layer closest to the blocking dielectric layer 135), and one or more intervening layers, where the bottom and top layers have lower silicon contents (e.g., lower coefficient of extinction (k) values) than at least one intervening layer of the one or more intervening layers. For example, in an embodiment where the multi-layer composite SiRN layer 130 includes three layers, the bottom and top layers include lower silicon contents than that of the intervening layer. That is, the multi-layer composite SiRN layer 130 includes a low-high-low silicon content structure.

In an exemplary embodiment, the blocking dielectric layer 135 may be a dielectric layer disposed on the SiRN CT layer 130 (i.e., between the charge trapping layer 130 and the gate dielectric 137 and/or the gate layer 128). The blocking dielectric layer 135 can be made of, for example, silicon dioxide, oxynitride, silicon oxynitride, or the like. The materials should not be limited to such, and the blocking dielectric layer 135 can be made of other materials or combination of materials as will be apparent to those skilled in the relevant art(s). For example, as discussed in more detail below with respect to the formation of the gate dielectric 137, the blocking dielectric layer 135 can include one or more oxides (e.g., silicon oxide, oxynitride, or the like).

In an exemplary embodiment, one or more gate dielectrics 137 are formed on the blocking dielectric layer 135 in the memory core and periphery of the CT-NOR memory array structure 100. The gate dielectric 137 can include, for example, one or more oxides (e.g., silicon oxide, oxynitride, or the like) and/or one or more high-k dielectrics. The high-k dielectrics can include, for example, $Al_2O_3$, $LaO_x$, $HfO_2$, and/or HfSiO. However, the materials should not be limited to these examples, and the gate dielectric 137 (including one or more of the high-k dielectrics) can be made of other materials or combination of materials as will be apparent to those skilled in the relevant art(s).

The one or more gate dielectrics 137 can be formed utilizing, for example, one or more well-known thermal oxidation processes and/or one or more well-known deposition processes. In an exemplary embodiment, the one or more gate dielectrics 137 include one or more oxides that are formed using one or more well-known thermal oxidation processes, and one or more high-k dielectrics that are formed using one or more well-known deposition processes. In this embodiment, the formation of the oxides will contribute to the thickness of the blocking dielectric layer 135, while the one or more high-k dielectrics will be deposited on the blocking dielectric layer 135. That is, the blocking dielectric layer 135 will include one or more oxides (e.g., silicon oxide, oxynitride, or the like) following the thermal oxidation processes of the gate dielectric 137.

In an exemplary embodiment, the one or more gate dielectrics 137, including the one or more oxides and the one or more high-k dielectrics, are formed using one or more well-known deposition process. That is, the one or more oxides and the one or more high-k dielectrics are deposited on the blocking dielectric layer 135 utilizing one or more well-known deposition processes.

In an exemplary embodiment, the gate layer 128 can be a semiconductor or a conductor layer disposed on the gate dielectric 137 and/or the blocking dielectric layer 135 opposite the charge trapping layer 130. For example, the gate layer 128 may be a polysilicon layer having a heavy doping concentration of the first type and/or second type of impurity, a metal layer, or a layer including a combination of both metal and polysilicon. The gate layer 128 can be deposited utilizing, for example, a chemical vapor deposition (CVD) and/or another well-known deposition process.

In operation and in an exemplary embodiment, the charge-trapping NOR (CT-NOR) memory device 102 can be programmed utilizing channel hot election (CHE) injection techniques. In erasing the charge-trapping NOR (CT-NOR) memory device 102, electron Fowler-Nordheim (FN) tunneling erasure techniques can be used to remove electrons held by the SiRN CT layer 130. In particular, the FN tunneling techniques can be used due to the conductive properties of the SiRN CT layer 130. In contrast, in a standard nitride CT layer, hot hole injection techniques are used due to the insulative properties of standard nitride CT layers. In exemplary embodiments, by utilizing FN tunneling techniques, the CT-NOR memory device 102 can reduce charge losses typically found in devices utilizing hot hole injection techniques because such devices typically require a thinner tunneling dielectric layer. Further, the CT-NOR memory device 102 can avoid damage to silicon-oxide interface typically associated with hot hole injection techniques.

Figure 2:
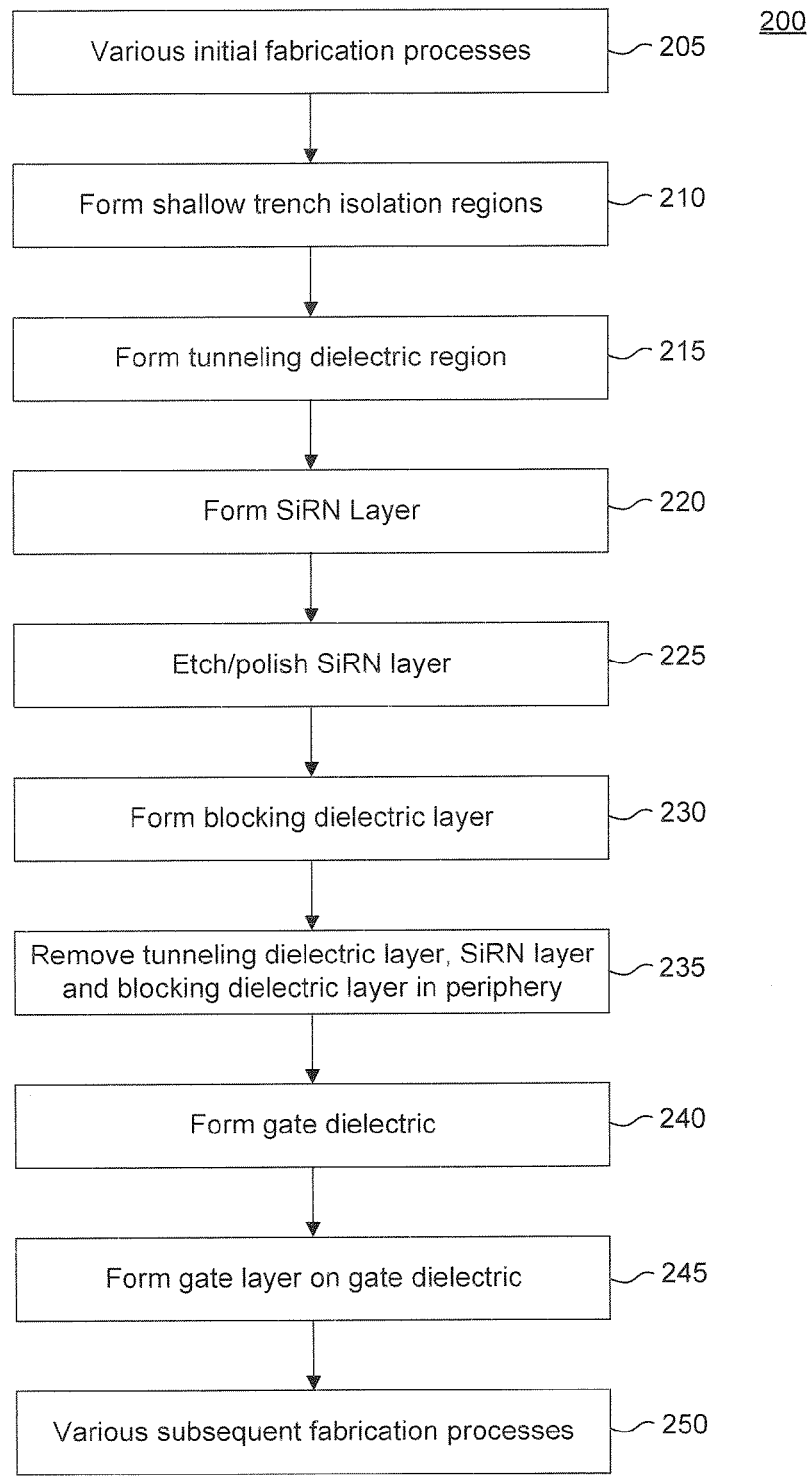
FIG. 2 illustrates a flowchart of a method of fabrication of a CT-NOR memory device according to an exemplary embodiment.

FIG. 2 illustrates a flowchart 200 of a method of fabricating a CT-NOR memory device 102 according to an exemplary embodiment. Flowchart 200 will be explained with reference to the examples shown in FIGS. 3A-3I, which illustrate fabrication of the CT-NOR memory device 102 according to an exemplary embodiment. However, the method illustrated in flowchart 200 is not limited to the examples shown in FIGS. 3A-3I. FIGS. 3A-3I are cross-sectional views of the CT-NOR memory device 102 of FIG. 1 taken along cut line 104 shown in FIG. 1.

The method of flowchart 200 begins at step 205, where various initial processes are optionally performed to a semiconductor wafer substrate 145. The initial processes can include, for example, cleaning, depositing, doping, etching and/or the like to form one or more regions. The substrate 145 can be a semiconductor doped at a first concentration with a first dopant type. In an exemplary embodiment, the substrate 145 can be silicon moderately doped with boron (P).

Figure 3A:
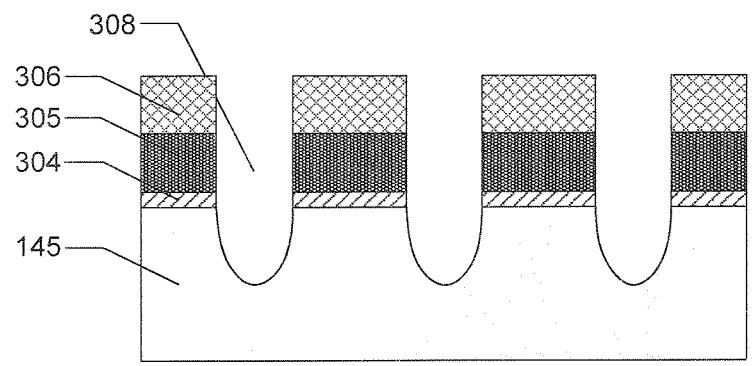
FIGS. 3A-3I illustrate cross-sectional views of a memory cell array structure according to an exemplary embodiment.

Referring now to FIG. 3A, at step 210, a plurality of shallow trench isolation (STI) regions 150 are formed by forming a plurality of trenches 308. FIG. 3A illustrates the trenches 308 after they have been formed through application of a sacrificial oxide 304 and a nitride layer 305, and etching utilizing a shallow trench isolation (STI) mask 306. These operations are discussed in more detail below.

In particular, in forming the plurality of trenches 308, the sacrificial oxide 304 was formed on the substrate 145 utilizing any well-known oxidation process.

Following the formation of the sacrificial oxide 304 and the nitride layer 305, a photo resist was deposited on the sacrificial oxide 304 and patterned to form the shallow trench isolation (STI) mask 306. The patterning can utilize, for example, any well-known photolithography process.

In the memory cell region of the CT-NOR memory array structure 100 exposed by the STI mask 306, the substrate 145, sacrificial oxide 304, and nitride layer 305 were then selectively etched to form the plurality of trenches 308. The selective etching can utilize any well-known etching process.

Following the selective etching, the STI mask 306 was removed by one or more well-known processes, including, for example, resist striping and/or resist ashing.

Figure 3B:
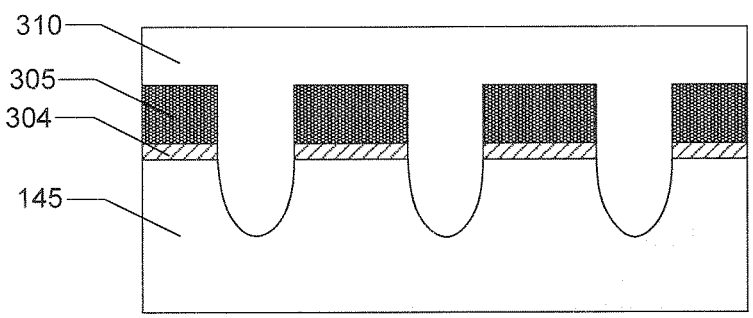
Figure 3C:
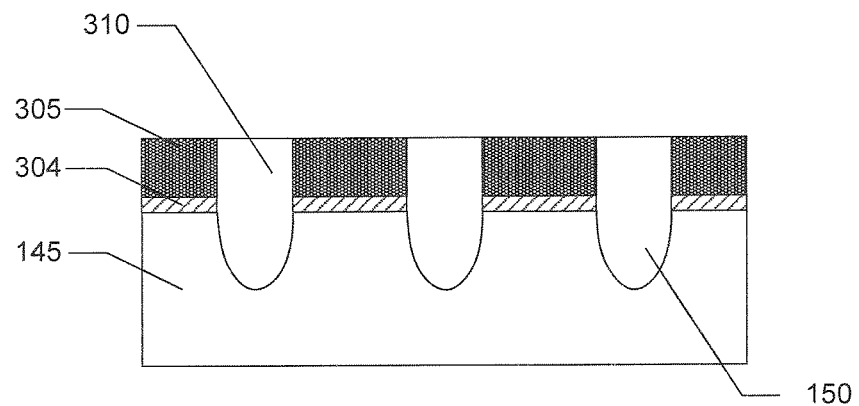

The formation of the shallow trench isolation regions 150 continues with reference to FIG. 3B, where the trenches 308 are filled with a dielectric 310. Following the application of the dielectric 310, and with reference to FIG. 3C, the dielectric 310 is polished back to form the shallow trench isolation (STI) regions 150. The polishing process can utilize any well-known chemical mechanical polishing (CMP) process. The sacrificial oxide 304 and the nitride layer 305 are then removed by any well-known selective etching process.

Figure 3D:
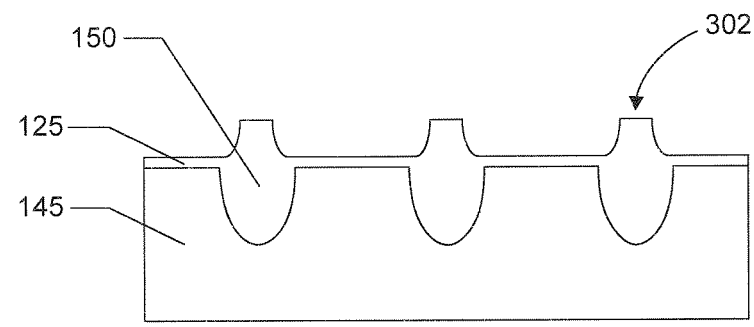

Referring to FIG. 3D, the flowchart 200 transitions to step 215, where one or more well-known oxidation processes are performed on the substrate 145 to form the tunneling (e.g., lower) dielectric layer 125. In an exemplary embodiment, the tunneling dielectric layer 125 is formed by oxidizing the exposed surface of the substrate 145 in the memory cell region by one or more well-known thermal oxidation processes. In another exemplary embodiment, the tunneling dielectric layer 125 is formed by depositing a silicon oxynitride film by, for example, one or more conventional chemical vapor deposition processes. The STI regions 150 can include a portion that extends above the substrate 145 that can be referred to as a STI mesa 302.

Figure 3E:
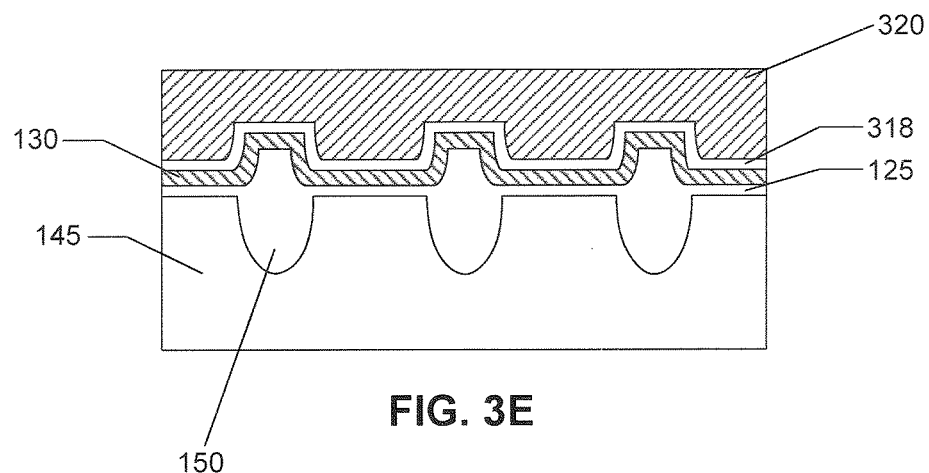

Now referring to FIG. 3E, the flowchart 200 transitions to step 220, where a silicon-rich nitride (SiRN) layer (e.g., SiRN CT layer 130) has been formed on the tunneling dielectric layer 125. In an exemplary process, SiRN CT layer 130 has been formed by depositing a silicon-rich nitride on the tunneling dielectric region 125. The SiRN CT layer 130 is deposited utilizing, for example, a chemical vapor deposition (CVD), an atomic layer deposition (ALD), and/or another well-known deposition process. In an exemplary embodiment, the SiRN CT layer 130 can have an atomic ratio of silicon to nitrogen that is about 3:4 or greater.

In an exemplary embodiment, and with continued reference to FIG. 3E, a sacrificial oxide layer 318 has been formed on SiRN CT layer 130. The formation of the sacrificial oxide layer 318 is performed utilizing one or more well-known oxidation processes. An organic BARC (bottom anti-reflecting coating) layer 320 has then been formed on the sacrificial oxide layer 318.

Figure 3F:
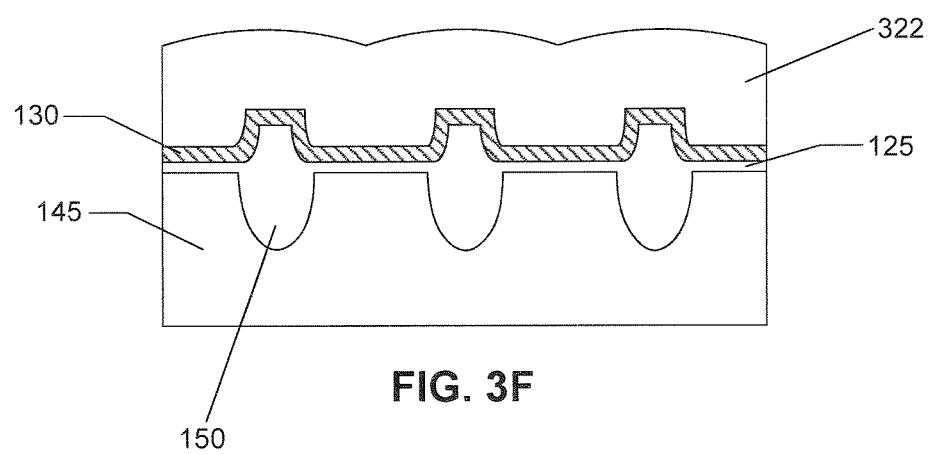

In an alternative exemplary embodiment, and with reference to FIG. 3F, rather than forming the sacrificial oxide layer 318 and organic BARC layer 320 on the SiRN CT layer 130 (see FIG. 3E), a thick sacrificial oxide layer 322 has been formed on SiRN CT layer 130. The formation of the thick sacrificial oxide layer 322 is performed utilizing one or more well-known oxide deposition processes. For example, the exemplary thick sacrificial oxide layer 322 illustrated in FIG. 3F can have a greater thickness above the STI regions 312.

Now referring to FIG. 3G, and as described in more detail below, the flowchart 200 transitions to step 225, where one or more well-known etching and/or polishing processes have been performed on the SiRN CT layer 130 and (i) sacrificial oxide layer 318 and organic BARC layer 320 (see FIG. 3E), or (ii) thick sacrificial oxide layer 322 (see FIG. 3F). For example, one or more well-known etching processes, chemical mechanical polishing (CMP) processes, and/or any such well-known removal processes can be performed to form isolated CT layer portions 326 of the SiRN CT layer 130.

Step 225 shall now be described in greater detail. In an exemplary embodiment, referring to FIGS. 3E and 3G, one or more well-known etching processes are performed on the organic BARC layer 320. The etching is performed so as to reduce the thickness of the organic BARC layer 320 to be sufficiently small so as not to extend above any of the STI mesas 302. That is, the etching removes the portions of the SiRN CT layer 130 located above the STI mesas 302 to expose the tops of the STI mesas 302. The etching may also expose the SiRN layer 130 above each of the STI regions 150. The remaining organic BARC layer 320 (between adjacent STI regions 150) is removed by one or more well-known plasma processes to expose portions of the sacrificial oxide 318 and SiRN CT layer 130. The sacrificial oxide 318 is selectively removed by one or more well-known wet or dry etching processes. The resulting SiRN CT layer 130 includes isolated CT layer portions 326 located between each of the STI regions 150 as illustrated in FIG. 3G.

Figure 3G:
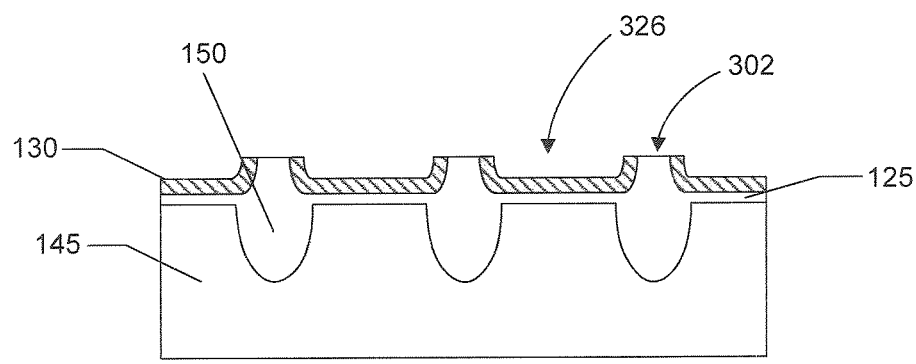

In another exemplary embodiment of step 225, referring to FIGS. 3F and 3G, selective polishing (e.g., Chemical Mechanical Polishing (CMP)) is performed on the thick sacrificial oxide layer 322. The CMP is performed so as to reduce the thickness of the thick sacrificial oxide layer 322 to be sufficiently small so as not to extend above any of the STI mesas 302. The CMP exposes the SiRN CT layer 130 above each of the STI regions 150. Following the CMP, one or more well-known etching processes are performed to selectively etch the portions of the SiRN CT layer 130 located on top of the STI mesas 302 (e.g., the exposed portions of the SiRN CT layer 130). Then the remaining thick sacrificial oxide layer 322 (between adjacent STI regions 150) is selectively etched to expose portions of the SiRN CT layer 130. The resulting SiRN CT layer 130 includes isolated CT layer portions 326 located between each of the STI regions 150 as illustrated in FIG. 3G.

Figure 3H:
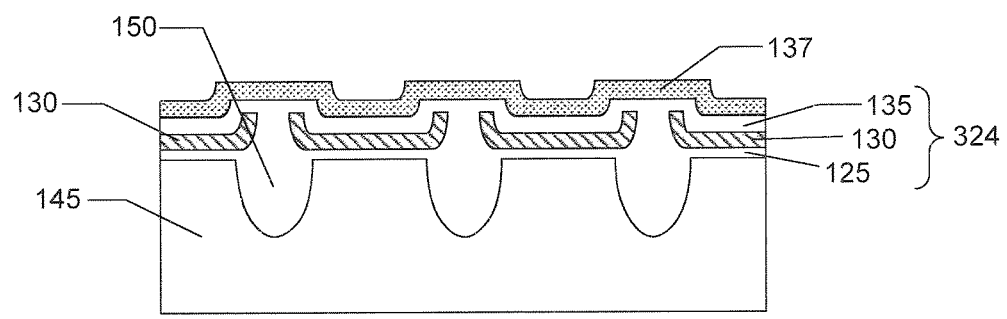

Now referring to FIG. 3H, the flowchart 200 transitions to step 230, where a blocking (e.g., upper) dielectric layer 135 is formed on the etched SiRN CT layer 130. The formation of the blocking dielectric layer 135 can utilize one or more well-known oxidation processes. In an exemplary embodiment, the blocking dielectric layer 135 has been formed by oxidizing the etched SiRN CT layer 130 in the memory cell array region by one or more well-known thermal oxidation processes. In another exemplary embodiment, the blocking dielectric layer 135 is formed by depositing a silicon oxide film by one or more well-known chemical vapor deposition processes on the etched SiRN CT layer 130. The blocking dielectric layer 135 together with the SiRN CT layer 130 and tunneling dielectric layer 125 can form SiRN charge trapping regions 324.

After the blocking dielectric layer 135 is formed, the flowchart 200 transitions to step 235, where the layers forming the SiRN charge trapping regions 324 (i.e., tunneling dielectric layer 125, SiRN CT layer 130, and blocking dielectric layer 135) are removed in the periphery of the CT-NOR memory array structure 100 by one or more well-known etching processes. It should be appreciated that the removal of the SiRN charge trapping regions 324 is not shown in FIG. 3H as the removal occurs in the periphery.

In an exemplary embodiment, and with continued reference to FIG. 3H, the flowchart 200 transitions to step 240, where one or more gate dielectrics 137 are formed on the blocking dielectric layer 135 in the memory core and periphery of the CT-NOR memory array structure 100. Again, it should be appreciated that the formation of the one or more gate dielectrics 137 in the periphery has not been shown in FIG. 3H. In an exemplary embodiment, the gate dielectric 137 can include, for example, one or more oxides (e.g., silicon oxide, oxynitride, or the like) and/or one or more high-k dielectrics. The high-k dielectrics can include, for example, $Al_2O_3$, $LaO_x$, $HfO_2$, and/or HfSiO. However, the materials should not be limited to these examples, and the gate dielectric 137 (including the high-k dielectrics) can be made of other materials or combination of materials as will be apparent to those skilled in the relevant art(s).

The one or more gate dielectrics 137 can be formed utilizing, for example, one or more well-known thermal oxidation processes and/or one or more well-known deposition process. In an exemplary embodiment, the one or more gate dielectrics 137 include one or more oxides that are formed using one or more well-known thermal oxidation processes, and one or more high-k dielectrics that are formed using one or more well-known deposition processes. In this embodiment, the formation of the oxides will contribute to the thickness of the blocking dielectric layer 135, while the one or more high-k dielectrics will be deposited on the blocking dielectric layer 135. In another exemplary embodiment, the one or more gate dielectrics 137, including the one or more oxides and the one or more high-k dielectrics, are formed using one or more well-known deposition processes. That is, the one or more oxides and the one or more high-k dielectrics are deposited on the blocking dielectric layer 135 utilizing one or more well-known deposition processes.

In an exemplary embodiment, prior to the formation of the one or more gate dielectrics 137, one or more well-known masking and implanting processes are performed in the periphery of the CT-NOR memory array structure 100 for channel doping. The areas of the periphery subjected to the implanting process(es) can be implanted with one or more well-known doping materials as will be apparent to those skilled in the relevant art(s).

Figure 3I:
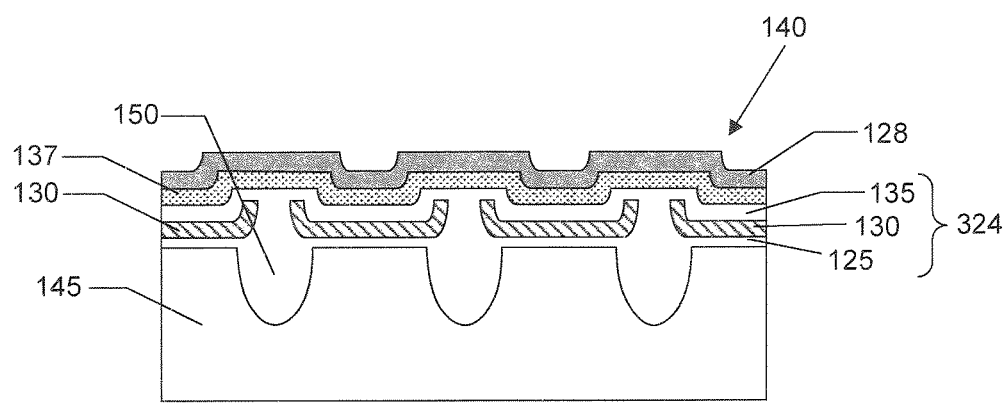

Now referring to FIG. 3I, the flowchart 200 transitions to step 245, where a gate region 140 is formed on the blocking dielectric layer 135 or on gate dielectric 137 by depositing a gate layer 128. That is, in an exemplary embodiment that includes the gate dielectric 137, the gate layer 128 is deposited on the gate dielectric 137. Conversely, in an exemplary embodiment that does not include the gate dielectric 137, the gate layer 128 is deposited on the blocking dielectric layer 135. The gate layer 128 can be a polysilicon layer, a metal layer, or a layer including a combination of both metal and polysilicon. The gate layer 128 can be deposited utilizing, for example, a chemical vapor deposition (CVD) and/or another well-known deposition process.

In an exemplary embodiment, a sacrificial polysilicon layer (not shown) is deposited on the blocking dielectric layer 135 instead of the one or more gate dielectrics 137 as discussed above. In this embodiment, one or more well-known high-temperature annealing processes are then performed. Next, one or more oxides (e.g., silicon oxide, oxynitride, or the like) are formed using one or more well-known rapid thermal processes. Next, one or more well-known polishing processes (e.g., Chemical Mechanical Polishing (CMP)) are performed to expose the sacrificial polysilicon layer, and then the sacrificial polysilicon layer is removed. Following the removal of the sacrificial polysilicon layer, one or more high-k dielectrics (e.g., $Al_2O_3$, $LaO_x$, $HfO_2$, and/or HfSiO) are formed on the now-exposed blocking dielectric layer 135 (i.e., the removal of the sacrificial polysilicon layer exposes the blocking dielectric layer 135) using one or more well-known deposition process. Next, a gate layer 128 that includes a metal layer is deposited in a similar process discussed above, and then one or more well-known polishing processes (e.g., Chemical Mechanical Polishing (CMP)) are performed to form gate region 140.

After step 245, the flowchart 200 transitions to step 250, where various subsequent processes are optionally performed. Such subsequent processes are discussed in more detail below with respect to FIGS. 4 and 5, and can include, for example, implanting, doping, etching, cleaning and/or the like, to further form the charge trapping, blocking dielectric, and gate regions and/or one or more additional regions, such as gate, source and drain contacts, peripheral circuits, interconnects, vias, a passivation layer and/or the like.

Figure 4:
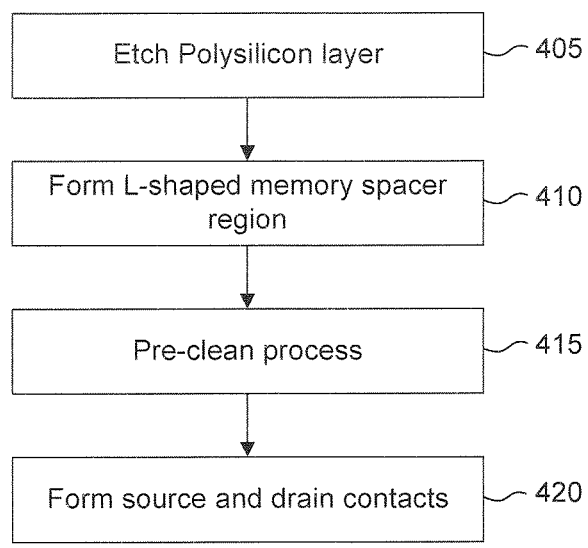
FIG. 4 illustrates a flowchart of a method of fabrication of a CT-NOR memory device according to an exemplary embodiment.

FIG. 4 shall now be described with reference to the examples shown in FIGS. 5A-5E, which illustrate an exemplary continued fabrication of the CT-NOR memory device 102. However, the method illustrated in flowchart 400 is not limited to the examples shown in FIGS. 5A-5E. FIGS. 5A-5E are cross-sectional views of the CT-NOR memory device 102 of FIG. 1 taken along cut line 103 shown in FIG. 1.

Figure 5A:
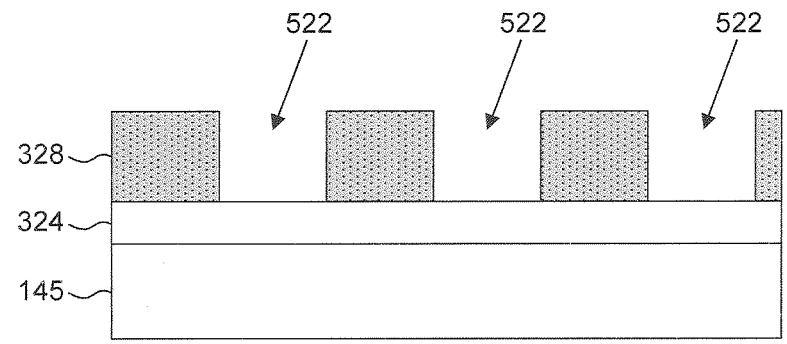
FIGS. 5A-5E illustrate cross-sectional views of a memory cell array structure according to an exemplary embodiment.

With reference now to FIGS. 4 and 5A, the method of flowchart 400 begins at step 405, where the gate layer 128 has been selectively etched. As illustrated in FIG. 5A, the gate layer 128 has been disposed on the gate dielectric 137, or on the SiRN charge trapping region 324, which includes the tunneling dielectric layer 125, the SiRN CT layer 130, and the blocking dielectric layer 135, all of which have been previously disposed on the substrate 145.

FIG. 5A illustrates trenches 522 that have been formed in the gate layer 128 as a result of selective etching. In an exemplary embodiment, the selective etching process includes the deposition of a photo resist on the gate layer 128, which is then patterned to form a gate mask (not shown). The patterning can utilize, for example, any well-known photolithography process.

In the memory cell region of the CT-NOR memory device 102 exposed by the gate mask, the gate layer 128 is then selectively etched to form the plurality of trenches 522, and thereby forming gate regions 140. The selective etching can utilize any well-known etching process. The gate mask is then removed by one or more well-known processes, including, for example, resist striping and/or resist ashing.

After the gate regions 140 (e.g., gate layer 128) are formed, the source and drain regions 110, 115 are both implanted utilizing similar implant conditions and/or similar masks, or utilizing different implant conditions and/or different masks. For example, the source and drain regions 110, 115 can be doped with phosphorous and/or arsenic, or with other doping materials as will be apparent to those skilled in the relevant art(s) utilizing any well-known masking and implanting processes.

At step 410, L-shaped memory spacer regions 560 are formed. In an exemplary embodiment, the L-shaped memory spacer regions 560 include a multi-layer structure having an oxide-nitride-oxide arrangement. The resulting L-shaped memory spacer regions 560 are illustrated in FIG. 5B, the formation of which is described in more detail below.

In particular, the formation of the L-shaped memory spacer regions 560 includes the deposition of an implant oxide 554 utilizing one or more well-known oxidation processes. A nitride layer 556 is then formed by depositing a nitride on the implant oxide 554. The nitride layer 556 can be deposited utilizing, for example, a chemical vapor deposition (CVD), an atomic layer deposition (ALD), and/or other well-known deposition process. Following deposition of the nitride layer 556, an oxide layer 558 is deposited utilizing one or more well-known oxidation processes.

Figure 5B:
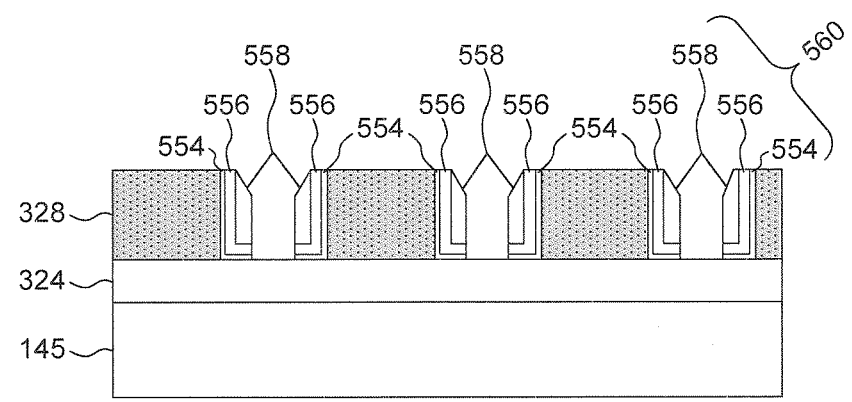

Following the deposition of the implant oxide 554, the nitride layer 556, and the oxide layer 558, selective etching is performed to form the L-shaped memory spacer regions 560, which are illustrated in FIG. 5B. The selective etching can utilize any well-known etching process.

Figure 5C:
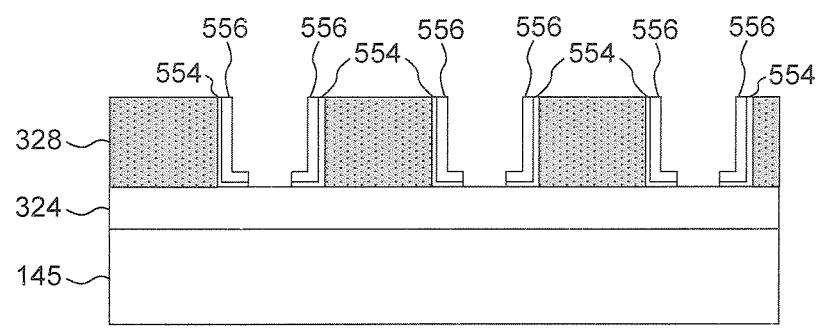

After step 410, and now referring to FIG. 5C, the flowchart 400 transitions to step 415, where a pre-cleaning process is performed on the L-shaped memory spacer regions 560, The pre-cleaning process removes the oxide layer 558 of the L-shaped memory spacer regions 560, and can utilize a CoSi pre-cleaning process, NiSi pre-cleaning process, or any other well-known etching process.

After step 415, the flowchart 400 transitions to step 420, where source contacts 570 and drain contacts 572 are formed in the L-shaped memory spacer regions 560. The formation of the source contacts 570 and the drain contacts 572 is described in more detail below with reference to FIGS. 5D and 5E.

Figure 5D:
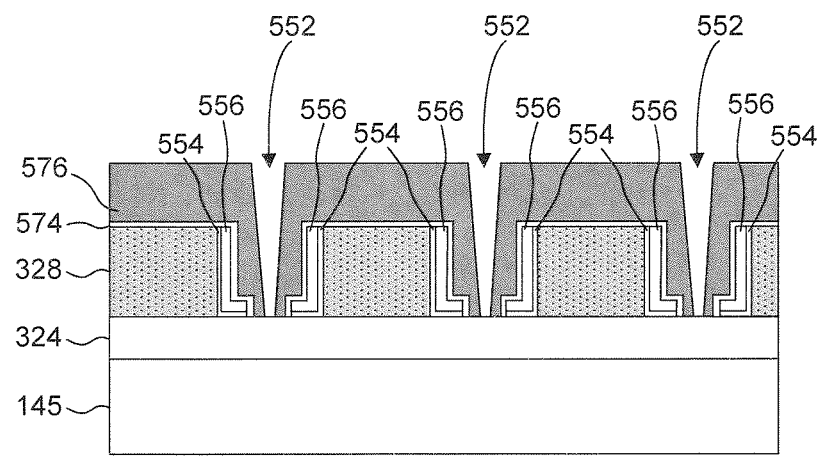

FIG. 5D illustrates the deposition of a contact etch stop layer (ESL) 574 (e.g., nitride layer) and a thick interlayer dielectric layer 576 (e.g., oxide layer). In particular, and in an exemplary embodiment, the contact etch stop layer (ESL) 574 and interlayer dielectric layer 576 are deposited on the pre-cleaned L-shaped memory spacer regions 560, The formation of the contact ESL 574 and the interlayer dielectric layer 576 can utilize well-known nitride and oxide deposition processes.

Following deposition of the contact ESL 574 and the interlayer dielectric layer 576 and CMP planarization, a photo resist is deposited and patterned to form a contact mask (not shown). The patterning can utilize, for example, any well-known photolithography process.

With continued reference to FIG. 5D, in the memory cell region of the CT-NOR memory device 102 exposed by the contact mask (e.g., the L-shaped memory spacer regions 560), the contact ESL 574 and interlayer dielectric layer 576 are then selectively etched to form the plurality of contacts 552. The selective etching can utilize any well-known etching process. The contact mask is then removed by one or more well-known processes, including, for example, resist striping and/or resist ashing.

Figure 5E:
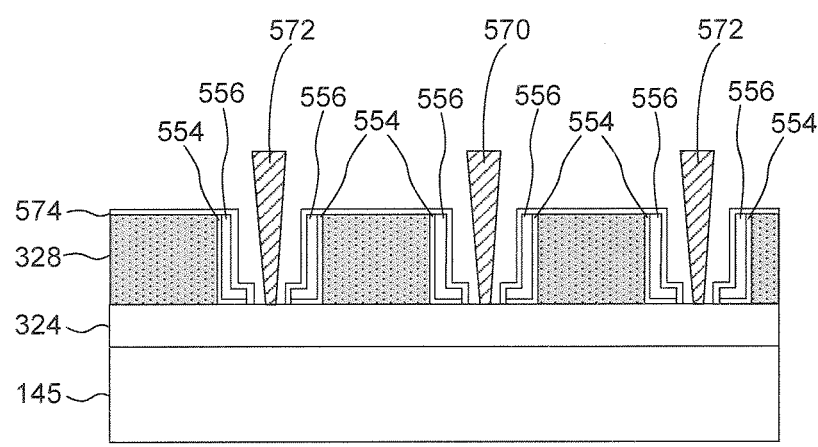

FIG. 5E illustrates the formation of source contacts 570 and drain contacts 572 in the contacts 552. In particular, following the formation of the contacts 552 by selective etching of the contact ESL 574 and interlayer dielectric layer 576, source contacts 570 and drain contacts 572 can be formed by any well-known deposition and etching/polishing processes. For example, the deposition of the source contacts 570 and drain contacts 572 can utilize, for example, a chemical vapor deposition (CVD) and/or other well-known disposition process. The etching/polishing process can utilize any well-known etching process and/or chemical mechanical polishing (CMP) process.

Following the formation of the source and drain contacts 570, 572, one or more well-known back end of line (BEOL) processes are performed. For example, the source contacts 570 can be connected to a first metallic material extending parallel to the gate region 140 (gate layer 128) and the drain contacts 572 can be connected to a second metallic material extending perpendicular to the gate region 140 (gate layer 128). The first and second metallic materials can be the same or different metallic materials, which can include, for example, copper, gold, silver, aluminum, and/or other well-known metallic materials or combination of materials as will be apparent to those skilled in the relevant art(s).

CONCLUSION

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A memory device, comprising:
a substrate comprising a source and a drain;
a lower dielectric layer disposed above the substrate;
a gate dielectric disposed above the lower dielectric layer;
a gate layer disposed above the gate dielectric;
an upper dielectric layer disposed below the gate dielectric, wherein the upper dielectric layer does not contact the gate layer; and
a silicon-rich nitride (SiRN) charge-trapping layer disposed between the lower dielectric layer and the upper dielectric layer, wherein:
the SiRN charge-trapping layer comprises a first distal-most end, a second distal-most end, and a middle portion;
a first surface of the first distal-most end and a second surface of the second distal-most end are disposed in a first plane and a third upper surface of the middle portion is disposed in a second plane below the first plane, the first plane and second plane being substantially parallel;
the first surface of the first distal-most end, the second surface of the second distal-most end, and the third upper surface of the middle portion each contact the upper dielectric layer without contacting the lower dielectric layer and without contacting the gate dielectric;
the upper and lower dielectric layers are at least in partial contact with each other; and
the memory device is a charge-trapping NOR (CT-NOR) memory device.

2. The memory device of claim 1, wherein the SiRN charge-trapping layer comprises first and second layers, the first and second layers having first and second silicon contents, respectively, and wherein the first and second silicon contents are different from each other.

3. The memory device of claim 2, wherein the first silicon content is greater than the second silicon content, and the first layer is disposed closer to the lower dielectric layer than the second layer.

4. The memory device of claim 1, wherein the silicon-rich nitride (SiRN) charge-trapping layer comprises a plurality of charge-trapping portions isolated from one another through a bottom anti-reflecting coating (BARC) layer deposition and etching process.

5. The memory device of claim 1, wherein the silicon-rich nitride (SiRN) charge-trapping layer comprises a plurality of charge-trapping portions isolated from one another through an oxide layer deposition and removal process.

6. The memory device of claim 1, wherein the gate layer comprises at least one of polysilicon or metal.

* * * * *